(12) United States Patent
Guerra et al.

(10) Patent No.: US 9,820,141 B2
(45) Date of Patent: Nov. 14, 2017

(54) RECEIVER AND CORRESPONDING PROCESS

(71) Applicant: STMicroelectronics S.r.l., Agrate Brianza (IT)

(72) Inventors: Ranieri Guerra, S. Giovanni la Punta (IT); Roberto Larosa, Viagrande (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/279,765

(22) Filed: Sep. 29, 2016

(65) Prior Publication Data

US 2017/0265062 A1 Sep. 14, 2017

(30) Foreign Application Priority Data

Mar. 14, 2016 (IT) .......................... 102016000026515

(51) Int. Cl.
*H04B 7/00* (2006.01)
*H04B 1/06* (2006.01)
*H04W 8/22* (2009.01)
*H04B 17/318* (2015.01)

(52) U.S. Cl.
CPC ............ *H04W 8/22* (2013.01); *H04B 17/318* (2015.01)

(58) Field of Classification Search
CPC ........ H03G 3/00; H03G 3/008; H03G 3/3026; H03G 3/3052; H03G 11/08; H03G 2201/502; H03G 2201/60
USPC .......................................... 455/232.1, 240.1
See application file for complete search history.

(56) References Cited

U.S. PATENT DOCUMENTS

| | | | | |
|---|---|---|---|---|
| 3,949,294 A | | 4/1976 | Imura | |
| 5,864,591 A | * | 1/1999 | Holcombe | ............. H04B 10/11 375/345 |
| 5,898,912 A | * | 4/1999 | Heck | ...................... H03D 3/008 455/226.1 |
| 5,940,143 A | * | 8/1999 | Igarashi | ............... H03G 3/3052 348/678 |

(Continued)

OTHER PUBLICATIONS

Italian Search Report and Written Opinion for IT Appl. No. 102016000026515 dated Nov. 9, 2016 (8 pages).
Markus Ortner et al: "A fully integrated homodyne downconverter MMIC in SiGe:C for 60 GHz wireless applicants", Silicon Monolithic Integrated Circuits in RF Systems (SIRF), 2011 IEEE 11th Topical Meeting on, IEEE, Jan. 17, 2011 (Jan. 17, 2011), pp. 145-148.

(Continued)

*Primary Examiner* — Simon Nguyen
(74) *Attorney, Agent, or Firm* — Gardere Wynne Sewell LLP

(57) ABSTRACT

A receiver for digital signals includes a radiofrequency stage. A feedback loop controls an amplitude of a modulated radiofrequency signal passing through the radiofrequency stage as a function of a comparison of a baseband signal with a reference value. A baseband stage includes an RC network cascaded to the radiofrequency stage and coupled to a baseband detector that generates the baseband signal. The feedback loop includes a circuit for detecting a range of variation of the comparison. The amplitude of the modulated radiofrequency signal is controlled as a function of an end value (e.g., maximum or minimum) of the detected range of variation. A switching circuit operates to selectively short circuit a resistive component of the RC network during receiver start-up.

22 Claims, 10 Drawing Sheets

(56) References Cited

U.S. PATENT DOCUMENTS

| | | | | |
|---|---|---|---|---|
| 5,970,040 | A * | 10/1999 | Bando | G11B 17/0405 369/30.9 |
| 7,230,988 | B1 * | 6/2007 | Hsu | H04B 1/26 375/259 |
| 8,446,994 | B2 * | 5/2013 | Rawlins | H04B 1/30 375/345 |
| 2003/0059065 | A1 * | 3/2003 | Wildhagen | H03G 3/001 381/107 |
| 2006/0293009 | A1 * | 12/2006 | Kobayashi | H03G 3/3036 455/232.1 |
| 2009/0247100 | A1 * | 10/2009 | Meltzer | H03G 3/3052 455/182.1 |
| 2012/0326782 | A1 | 12/2012 | Sano et al. | |

OTHER PUBLICATIONS

Shehhi Badreyya Al et al: "An 800[micro]W Peak Power Consumption, 24GHz (K-Band), Super-Regenerative Receiver with 200p J/bit Energy Efficiency, for IoT", 2016 29th International Conference on VLSI Design and 2016 15th International Conference on Embedded Systems (VLSID), IEEE, Jan. 4, 2016 (Jan. 4, 2016), pp. 219-223.

Finocchiaro A., et al: "Design and Characterization of the Battery-less Transceiver with RF Energy Harvesting," Radio Frequency Advanced Design Center, Universita Degli Studi Di Catania, STMicroelectronics Catania Site, Sep. 19, 2012 (31 pages).

* cited by examiner

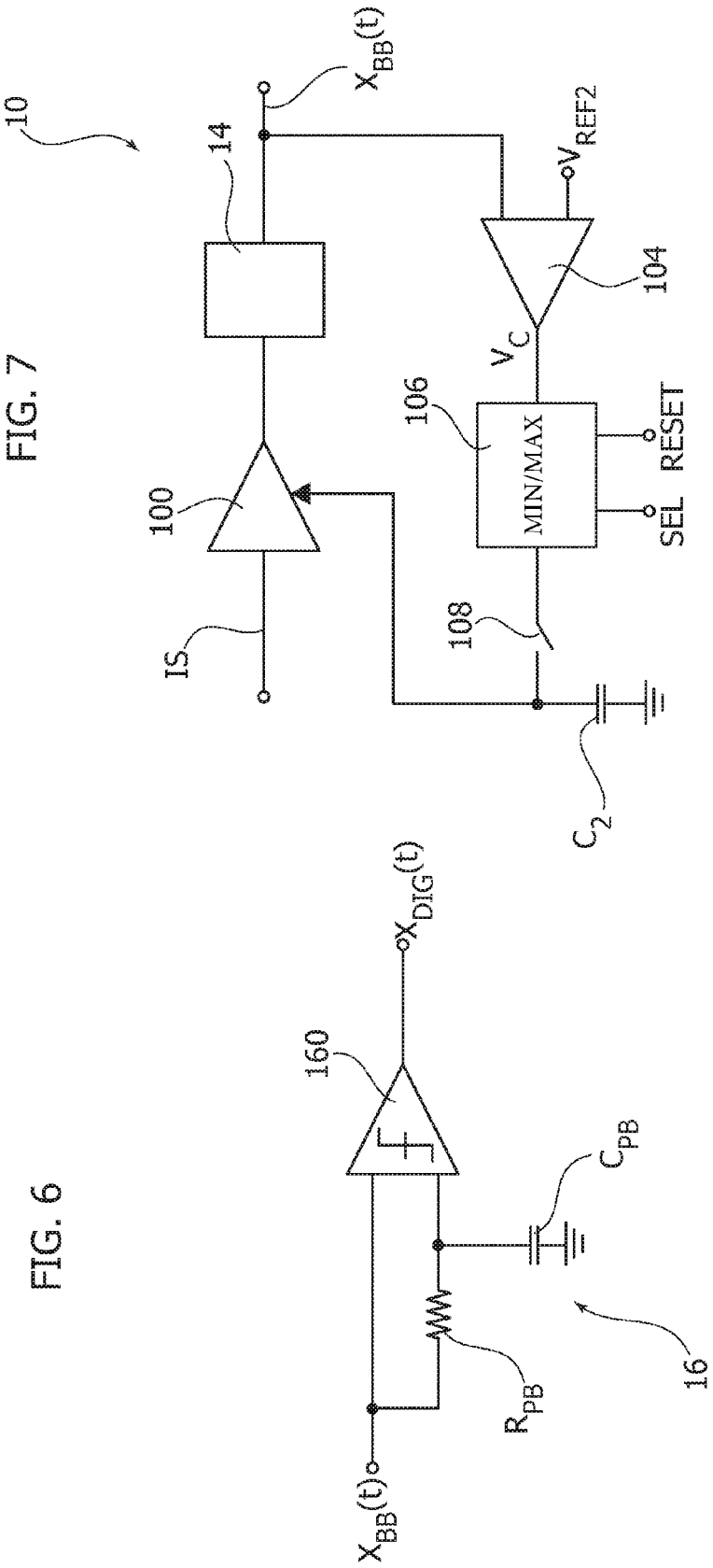

RECEIVER AND CORRESPONDING PROCESS

PRIORITY CLAIM

This application claims priority to Italian Application for Patent No. 102016000026515 filed Mar. 14, 2016, the disclosure of which is incorporated by reference.

TECHNICAL FIELD

The present description relates to receivers for communications. One or more embodiments may find use in contexts of application with limited energy availability, such as, for example, nodes of battery-less sensors that obtain their energy by means of harvesting techniques.

BACKGROUND

In contexts of application such as those to which reference has been made previously, the amount of energy stored is in general limited and is frequently just sufficient to guarantee a single reception (and possible transmission), at the end of which the energy level must again be restored.

Notwithstanding the extensive activity of innovation performed in the sector, there is still felt the need to make available solutions that are further improved from various standpoints, such as, for example, the capacity of functioning in the presence of an asynchronous-frequency reference, irrespective of the data rate and the carrier of the signal received, and/or the capacity of optimizing the use of the energy dissipated as a function of the number of bits received, these being factors that can assume importance in contexts of application with stringent band limitations and consequently low data rate.

SUMMARY

One or more embodiments enable provision of a reception system that can be used for a generic ASK (Amplitude Shift Keying) modulation format with a RZ (Return to Zero) binary symbol coding.

One or more embodiments enable provision of a reception system that is able to function in the presence of an asynchronous frequency reference, irrespective of the data rate and the carrier of the signal received.

One or more embodiments enable provision of a reception system that is able to optimize the energy dissipated as a function of the number of bits received, and is hence particularly suited to contexts of application with stringent limitations of band and consequently low data rate.

In an embodiment, a receiver for digital signals comprises: a radiofrequency circuit with an input for receiving a modulated radiofrequency signal, said radiofrequency circuit including a feedback loop for controlling an amplitude of said modulated radiofrequency signal as a function of a comparison with a reference value, and a baseband circuit cascaded to said radiofrequency circuit, said baseband circuit coupled with a baseband detector acting on said modulated radiofrequency signal, said baseband circuit configured to generate a decodable baseband signal from a detection signal of said baseband detector and including an RC network. The feedback loop of said radiofrequency circuit includes a detector of a range of variation of said comparison, said detector configured to control the amplitude of said modulated radiofrequency signal as a function of an end value of the range of variation. The baseband circuit further includes a switching circuit configured to selectively short-circuit a resistive component of said RC network.

In an embodiment, a receiver for digital signals comprises: a radiofrequency circuit configured to receive a modulated radiofrequency signal and including a variable gain amplifier configured to output an amplified modulated radiofrequency signal, a baseband detector configured to generate a detection signal from said amplified modulated radiofrequency signal, a feedback loop configured to receive the detection signal and control an amplification by the variable gain amplifier. The feedback loop comprises: a comparator circuit configured to compare said detection signal to a reference, a circuit configured to detect a range of variation of an output from said comparator circuit, and a control circuit configured to control the amplification of the variable gain amplifier as a function of an end value of the range of variation.

In an embodiment, a receiver for digital signals comprises: a radiofrequency circuit configured to receive a modulated radiofrequency signal and including a variable gain amplifier configured to output an amplified modulated radiofrequency signal, a baseband detector configured to generate a detection signal from said amplified modulated radiofrequency signal, a baseband circuit configured to generate a decodable baseband signal from said detection signal, wherein the baseband circuit includes an RC network, and a switching circuit configured to selectively short-circuit a resistive component of said RC network.

BRIEF DESCRIPTION OF THE DRAWINGS

One or more embodiments will now be described, purely by way of non-limiting example, with reference to the annexed drawings, wherein:

FIG. 6 exemplifies a possible embodiment of a baseband circuit;

FIG. 7 exemplifies a possible embodiment of a gain control loop;

DETAILED DESCRIPTION

In the ensuing description, various specific details are illustrated in order to provide an in-depth understanding of various examples of embodiments according to the present description. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in various points of the present description do not necessarily refer exactly to one and the same embodiment. Moreover, particular conformations, structures, or characteristics may be combined in any adequate way in one or more embodiments.

The references used herein are provided merely for convenience and hence do not define the sphere of protection or the scope of the embodiments.

Provision of a low-energy reception system may take into account various factors, such as the modulation format, the decoding procedures, the distribution of the functions between analog and digital circuits, and their respective optimization.

The factors listed above may all contribute to achieving the end result, where the choice of the modulation format is such as to represent a factor that more than others affects the complexity of the system as a whole and consequently its energy requirement.

Figure 1:
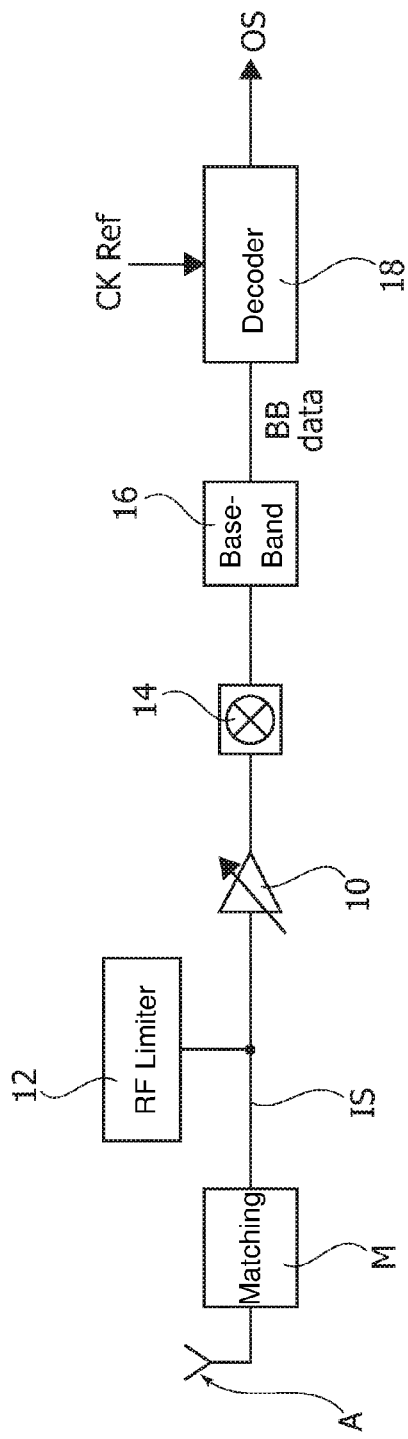
FIG. 1 illustrates a functional block diagram of an ASK receiver.

FIG. 1 presents by way of example a possible functional block diagram of a generic receiver for an amplitude-modulated signal, which is a modulation format that proves particularly simple to receive.

In addition to an antenna A and to a possible matching network M (which constitute external non-integrated elements common to any receiver) in the diagram provided by way of example of FIG. 1 there is represented the possible presence of a radiofrequency amplifier (RFA) stage 10 with gain control that is designed to amplify a radiofrequency (RF) input signal IS, received from the antenna A, according to the value required by the receiving chain itself. Irrespective of the characteristics of the amplifier stage, control of the gain can be performed so as to adapt the level of amplification imposed by the amplifier stage 10 to the value of incident power/voltage.

There may also be envisaged the presence of an amplitude-limiter (or RF-limiter) stage 12, which is designed to reduce, for example in a linear way, the level of the input signal in the case of high incident power. In this regard, it is possible to get the control loop to provide a good linearity to prevent any distortion of the signal such as to hinder correct reception thereof. For instance, the block 12 can be active (only) when the level of incident power is so high as to saturate the signal at any point along the receiving chain. If present, the block 12, in combination with the RF stage 10, can determine the overall dynamic range of the receiver itself and define the possible variation of the incident power within the context of application.

Downstream of the amplifier stage 10 there may then be present a block 14 for frequency down-conversion of the RF signal received, which is designed to obtain a copy of the modulating baseband signal. A baseband circuit 16 cascaded to the block 14 enables amplification and digitization of the above modulating signal, supplying a signal BB Data to a digital decoder 18, which is designed to determine the binary content of information as a function of the encoding chosen, expressing it as output signal OS. The decoder 18 can operate with a generic clock reference CK Ref that supplies the clock to the digital circuits.

The general diagram of FIG. 1 corresponds, on the other hand, to criteria of production and operation known in the art, which renders a more detailed description herein superfluous.

The above substantially applies (with the exception of the aspects treated in detail in what follows) also to implementation of the various stages or (sub)blocks 10 to 18 just described.

The above implementation may be more or less complex also according to the symbol coding chosen. For instance, to simplify the receiver system, an ASK (amplitude shift keyed) modulation format, with an RZ (return to zero) binary symbol coding, may be adopted, it being possible in this way to have, for example:

a reduced complexity of the digital decoder 18, which may include a simple combination of basic digital cells and delay cells that manage proper sampling of the datum;

ease of clock recovery, which can be obtained via elementary procedures directly using the signal received and exploiting the internal transitions thereof within the bit time: in this way, it is possible to avoid the use of dedicated preambles that increase latency of the system, jeopardizing energy efficiency thereof; and elimination of synthesizers and synchronous time references: using a binary amplitude modulation, the operation of frequency down-conversion can be obtained by means of envelope-detector circuits, avoiding the use of mixers and possible local tones produced by synthesizers.

In addition, determination of the bit time can be performed in relative terms by making use of asynchronous references that can be easily obtained also in integrated form, and by counting the number of pulses exchanged between certain transitions of the baseband signal received.

Figure 2:
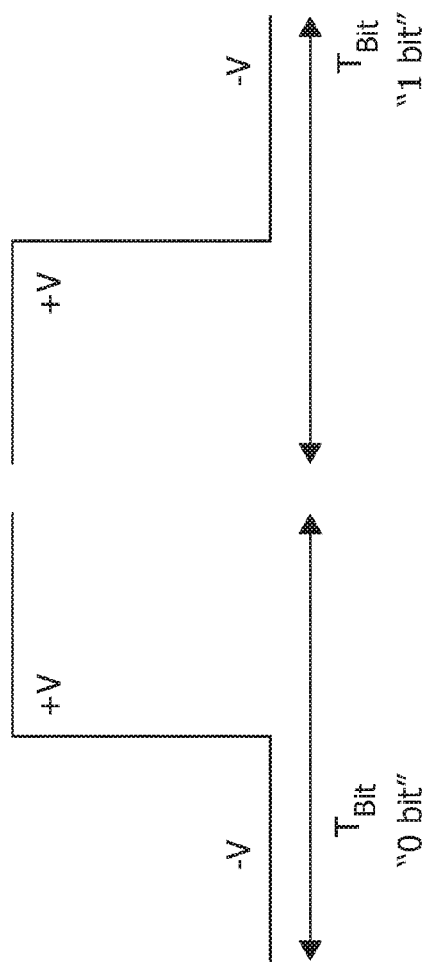
FIG. 2 exemplifies an MPE (Manchester Phase Encoder) coding.

FIG. 2 exemplifies a common case of RZ-ASK binary modulation, in which the symbols '0' and '1' are transmitted through a Manchester coding of an MPE (Manchester Phase Encoder) type according to the ETSI 802.3 Ethernet standard.

It should be emphasized that this is an example in so far as considerations similar to the considerations made for this modulation format are in any case also valid for and can be extended to other RZ-ASK modulations, such as, for example, PWM (Pulse Width Modulation) and the like.

In particular, presented in FIG. 2 are the symbols associated to the bits '1' and '0' in their own bit time or bit period $T_{Bit}$. At the instant $0.5 \cdot T_{Bit}$, there occurs—in opposite directions, according to the symbol transmitted—a transition of level between +V and −V that favors clock recovery; moreover, according to the definition of RZ, the zero (negative) level of the signal is always present within the bit time.

Figure 3A:
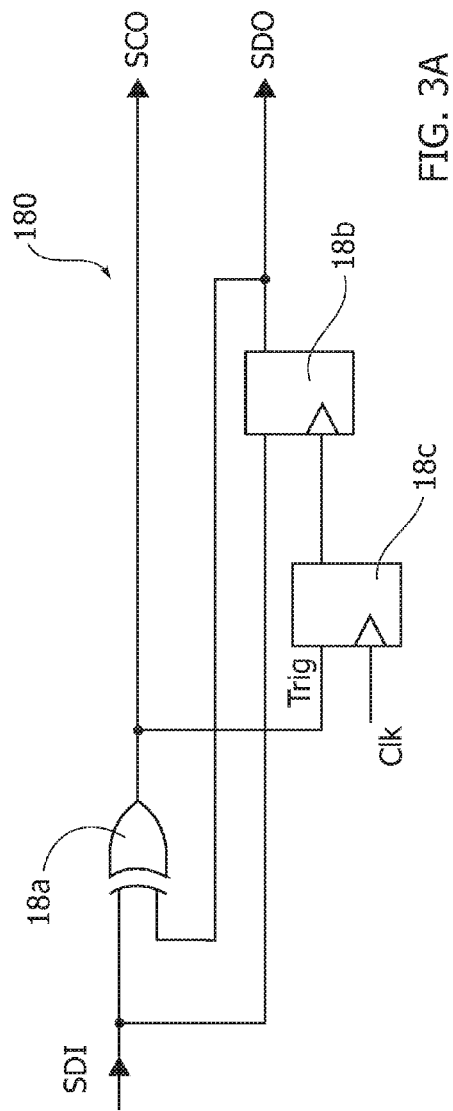
FIGS. 3A-3B exemplifies the general diagram of a digital Manchester decoder and possible corresponding digital signals.
Figure 3B:
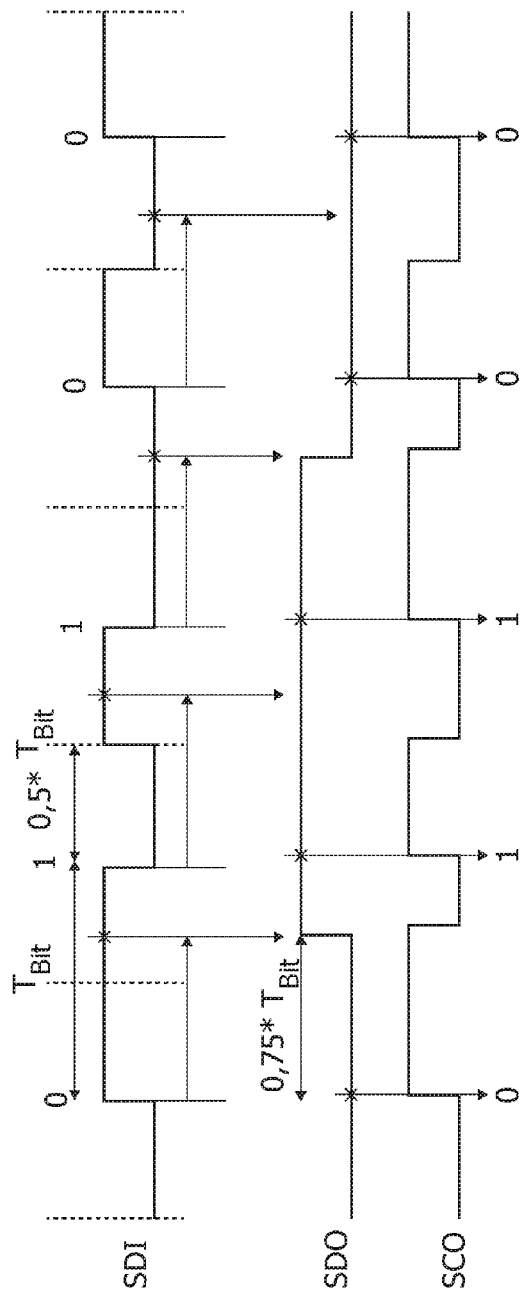

Provided by way of example in FIG. 3A are a possible decoder circuit, and in FIG. 3B the possible timing chart of the digital signals produced.

In one or more embodiments, the decoder (designated by 180, for reasons that will emerge more clearly in what follows) may include:

an XOR logic gate 18a, which receives on one of its inputs serial data SDI and supplies at output a serial-clock output SCO;

a D flip-flop 18b, which receives at input the serial data SDI and supplies at output output serial data SDO, where the latter are sent back also to the other input of the XOR gate 18a; and a delay cell 18c with a delay value of $0.75 \cdot T_{Bit}$ (see FIG. 2), which manages proper sampling of the datum by the flip-flop 18b, starting from the output of the XOR gate 18a (used as trigger signal Trig) and from a clock signal Clk.

Especially for data rates that are not known beforehand or in the presence of an asynchronous clock reference, the delay cell 18c may require a more articulated strategy of implementation, for example, based upon determination of the bit time or bit period $T_{Bit}$ as a function of the available clock reference. The delay can hence be obtained by means of a digital counter that transfers at output the start-of-count signal (Trig) when an appropriate value is reached, thus determining the instant of sampling for the signal received.

The bit time $T_{Bit}$ can be determined by counting the number of pulses of the available clock reference between two consecutive transitions of the digital signal received. For the coding considered by way of example, this time may correspond to $0.5 \cdot T_{Bit}$ if the succession of two identical bits is considered; otherwise, for different bits, this time may correspond to $T_{Bit}$.

Discrimination between period and/or half-period can be made by comparing successive counts iteratively until their ratio is close to 2 (or 0.5). The technique just set forth applies (in an even simpler form) to PWM techniques.

Figure 4:
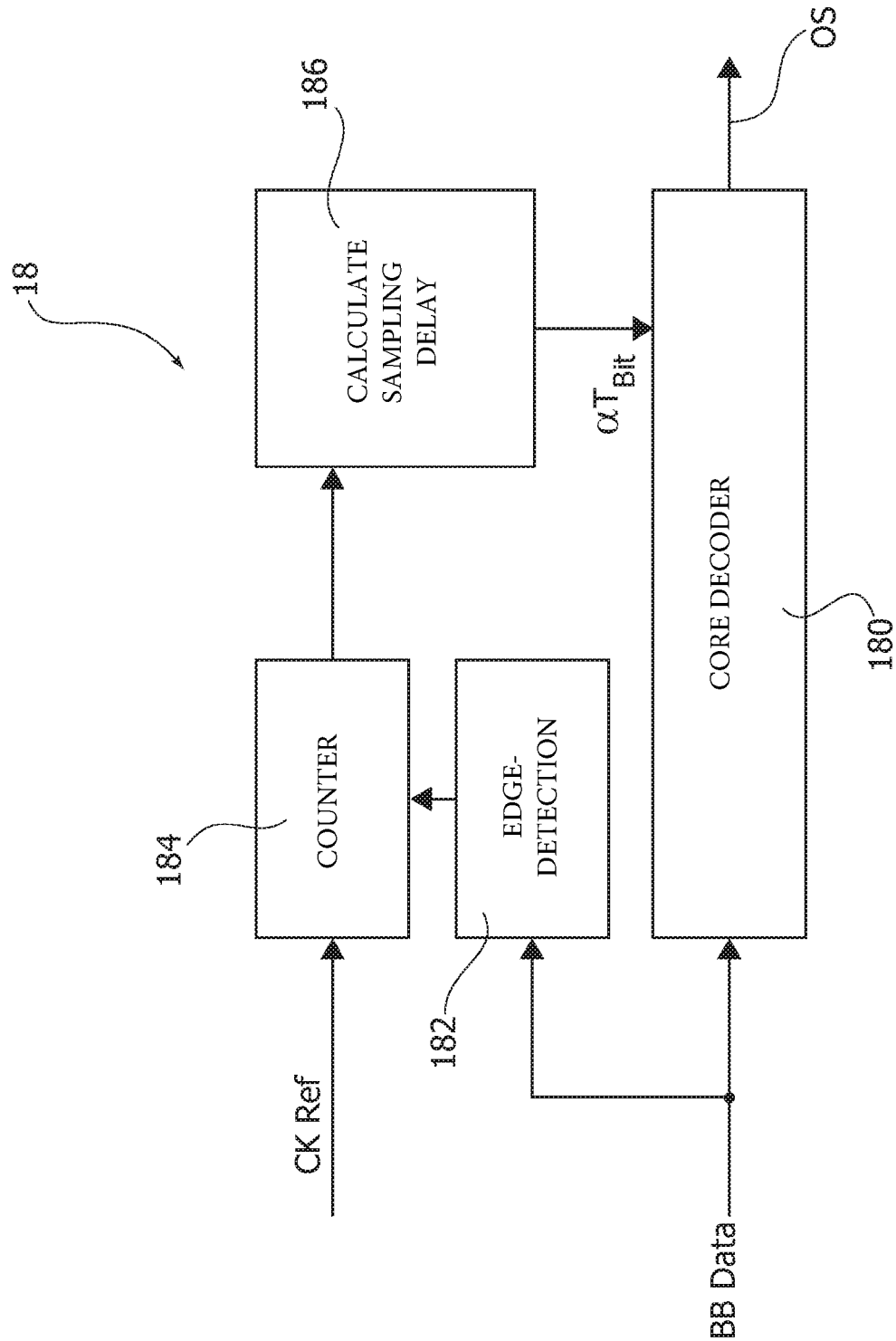
FIG. 4 is a diagram of a digital-demodulation and clock-recovery block.

FIG. 4 exemplifies a possible block diagram of a generic digital-demodulation module with clock recovery (for general reference see once again the block 18 of FIG. 1) for RZ-ASK binary modulations, with an asynchronous clock reference CK Ref.

In the above diagram there may be highlighted:
- a basic decoder block, referred to as "core decoder", which may include a circuit such as the circuit 180 of part a) of FIG. 2 and is designed to receive at input the signals BB Data (see FIG. 1 for reference);
- an edge-detection logic block 182, which also receives at input the signals BB Data and, in combination, for example, with a counter 184 driven by the clock signal CK Ref, can determine the number of pulses of the clock signal CK Ref between given events (transitions) as a function of the coding used; and
- a block for calculating the sampling delay 186, which, as a function of the data supplied by the counter 184, can determine $T_{Bit}$ and consequently the sampling delay $\alpha T_{Bit}$ within the core detector 180.

Correct data decoding and clock recovery can be all the more facilitated the less the digital signal received at input has been perturbed by the (analog) receiving/demodulating circuitry. These perturbations may either be phenomena of a statistical nature, deriving, for example, from noise present in the receiver circuit, or phenomena of a deterministic nature, linked, for example, to phenomena of nonlinearity and/or filtering due to the various sub-blocks traversed.

Irrespective of the nature of the perturbing phenomenon, the effect on the digital signal may present in the form of an error on the instant of transition. Even though the decoding technique may ideally tolerate a certain level of error on the transition instant, the capacity of reducing as far as possible, for example, the deterministic distortions of the system enables improvement of performance in terms of sensitivity and robustness.

Figure 5:
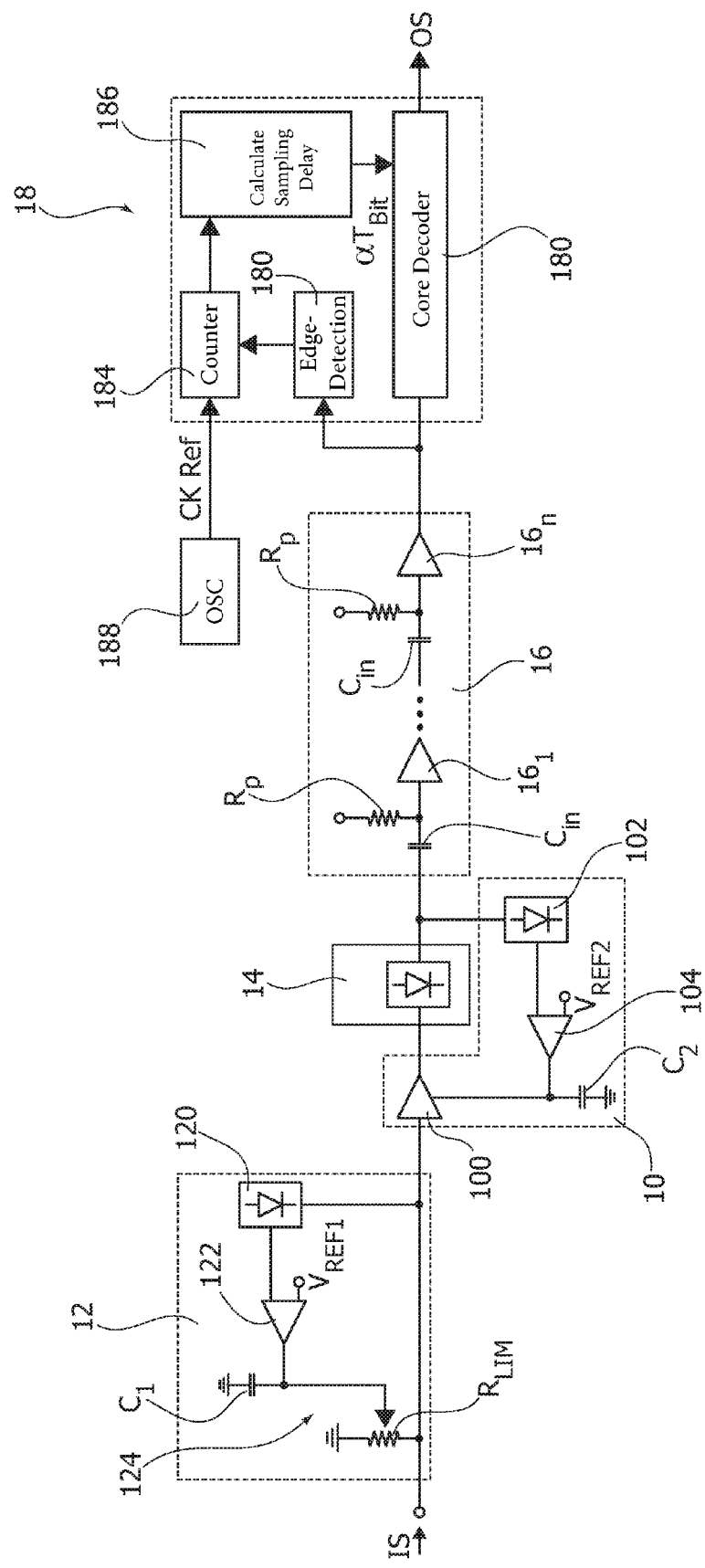
FIG. 5 exemplifies a possible embodiment of an ASK receiver.

FIG. 5 exemplifies a possible embodiment of a receiver according to the general scheme of FIG. 1, which contains a block of the type exemplified in FIG. 4.

FIG. 5 highlights, for example, the fact that the input RF limiter circuit 12 can be obtained with a purely analog control loop, based upon a generic average detector 120, which detects the amplitude of the input signal IS and compares it with a reference $V_{REF1}$ by means of an error amplifier 122. The error amplifier 122 acts on a variable resistance $R_{LIM}$, obtained, for example, with a MOSFET in triode configuration, modifying its value, for example, reducing its equivalent value when the amplitude of the input signal IS is excessive. The reference value $V_{REF1}$ may be chosen in such a way that the attenuated signal can be received without any significant saturation and/or distortion by the receiving chain downstream. A capacitance $C_1$ at the output of the error amplifier 122 may facilitate filtering of any possible disturbance on the control signal and contribute to stability of the control loop. The maximum value of the resistance $R_{LIM}$ may be chosen so as not to vitiate the level of impedance represented by the receiver in the open-loop condition, i.e., when the amplitude of the output signal does not require any limitation.

FIG. 5 likewise highlights the fact that also the gain control of the stage 10 can be conceived in a completely analog form, operating by means of a control signal on a generic mechanism for variation of gain of the radiofrequency amplifier (RFA) 100.

To increase rejection at the carrier frequency, it is possible to detect the amplitude of the amplified signal downstream of the envelope detector 14, using a further average detector 102 that determines an averaged-amplitude value of the modulating signal received.

The envelope detector 14 detects the modulating signal by performing the operation of frequency conversion, i.e., by translating into baseband the spectrum of the modulated signal around the RF carrier, thus giving rise to a signal $X_{BB}(t)$.

This signal can be sent at input to the average detector 102, and the averaged-amplitude value of the modulating signal received can be compared with a reference $V_{REF2}$ by means of an error amplifier 104. The error amplifier 104 acts on the gain of the amplifier 100 so as to provide a normalization of the amplitude of the signal sent at input to the envelope detector 14. Also in this case, the reference value $V_{REF2}$ may be chosen in such a way as not to give rise to any significant saturation and/or distortion of the receiving chain downstream. A capacitance $C_2$ at the output of the error amplifier 104 can once again facilitate filtering of any possible disturbance on the control signal and contribute to stability of the control loop.

The diagram exemplified here is not on the other hand imperative.

The criterion of applying to the modulated radiofrequency signal IS a variable gain (amplifier 100) as a function of the comparison (implemented in the amplifier 104) with a reference threshold $V_{REF2}$ is in fact suited to being implemented with different solutions, for example, by acquiring the signal directly at output from the amplifier 100 and/or possibly eliminating the average detector 102, hence assigning to the lowpass characteristic of the control loop the task of averaging the amplitude of the modulating signal received.

The binary nature of ASK modulation may favor the use of generic envelope-detector circuits in so far as the detected signal is not particularly jeopardized by the non-linearities introduced thereby.

It will hence be appreciated that both the gain-control stage 10 and the limiter stage 12 can in general be identified as radiofrequency stages with an input for the modulated radiofrequency signal IS, where these stages 10, 12 include a feedback loop (i.e., 100, 102, 104, $C_2$ for the gain-control stage 10 and 120, 122, $R_{LIM}$, $C_1$ for the limiter stage 12) for controlling, whether at the gain-control level or at the limitation level, the amplitude of the modulated radiofrequency signal IS as a function of a signal $V_c$ of comparison with a reference value ($V_{REF1}$ for the limiter stage 12 and $V_{REF2}$ for the gain-control stage 10).

The baseband circuit 16 of FIG. 5 produces the amplification and digitization of the modulating signal $X_{BB}(t)$ just detected.

It may hence be identified as a baseband stage cascaded to the at least one radiofrequency stage (i.e., 10 and, if present, 12), the baseband stage being coupled to a baseband detector—such as the envelope detector 14—which acts on the modulated radiofrequency signal IS for generating a decodable baseband signal $X_{DIG}(t)$, namely, one used, for example, as input BB Data of the circuit of FIG. 4, where the decodable baseband signal $X_{DIG}(t)$ is generated starting from the detection signal $X_{BB}(t)$ of the baseband detector 14, the baseband stage 16 including at least one RC network.

FIG. 5 highlights the fact that the above baseband circuit may be obtained by means of a cascade of low-frequency amplifiers $16_1$, . . . , $16_n$, which are designed to produce the signal $X_{DIG}(t)$. The amplifiers $16_1$, . . . , $16_n$ may be AC-coupled, via respective input capacitors $C_{in}$ with associated respective resistances $R_p$, for limiting propagation of the DC offset along the amplification chain itself.

An alternative solution for implementing the stage 16 is schematically exemplified in FIG. 6. It envisages the use of a threshold comparator 160, which makes the comparison between the modulating baseband signal $X_{BB}(t)$ and a reference that represents an averaged value thereof, obtained, for example, by means of a lowpass filter $R_{PB}$–$C_{PB}$ or any other average detector of a known type.

Whatever the solution adopted for producing it, the signal $X_{DIG}(t)$ can be supplied to the digital-demodulation and clock-recovery circuit 18 of the type already described previously, which is designed to operate with a clock reference CK Ref (not necessarily a synchronous one) generated, for example, by a ring oscillator (OC) 188.

A solution, as is exemplified in FIG. 5, can overcome in a satisfactory way the problem of low power consumption, but may present, however, limits when the energy effectively available in the application is (very) limited. The limited energy availability may be dealt with not only by reducing in consumption, but also by reducing the activation time so as to improve exploitation of the operating window.

In this regard, is has been noted that the times of locking of the two control loops (that of the RF limiter 12 and that of the AGC stage 10), as well as the time constants associated to the RC filters (e.g., $R_p$, $C_{in}$ or $R_{PB}$, $C_{PB}$) present in the baseband circuitry 16, irrespective of the implementation chosen, can assume high values if the purpose is pursued of supplying to the demodulator digital 18 a signal $X_{DIG}(t)$ that is as ideal possible. These time constants may bring about a distortion of the signal $X_{DIG}(t)$, which, if it is not controlled, may have adverse repercussions on proper operation of clock recovery and consequently on proper decoding and reconstruction of the datum received.

It has been noted that sizing of the above time constants may be strictly linked (e.g., proportional) to the data rate, with a resulting low compatibility with the energy requirements of the system as compared to the case of particularly low data rates. It has likewise been noted that the introduction of combined techniques such as to speed up the step of start-up of the circuit, without increasing the overall consumption involved, may contribute to overcoming the drawbacks outlined above.

In particular, it has been noted that a technique for speeding up start-up may be of particular interest in cases where the data rate of the application is particularly low, for example on account of limitations imposed in the available bandwidth.

For instance, the time of start-up of the receiver exemplified in FIG. 5 is proportional to the bit time $T_{Bit}$. The reason for this it that it is desirable for the time constants of the filters or of the control loops of the receiver to be sufficiently long as not to produce systematic alterations on the signal $X_{DIG}(t)$ at input to the digital demodulator 18.

Consequently, given the same energy available, given that the consumption levels of the receiver are mainly conditioned by the operating frequency of the RF carrier, the use of a low data rate may result not only in an evident reduction of the number of bits received during the operating window, but also in an appreciable increase of the fraction of useful time dedicated to the activation step.

One or more embodiments may consequently envisage introduction of techniques that, with a limited impact on consumption and complexity and without substantially modifying the structure exemplified in FIG. 5, produce a significant reduction of the start-up times. These techniques may envisage the limited introduction of strictly digital low-consumption blocks that are able in effect to operate (only) during the activation step, without significantly vitiating the average consumption of the system during the operating time.

FIG. 7 exemplifies one or more embodiments of the control loop 10 in which the problems regarding the time of locking of the control loop can be mitigated by modifying the loop 10 with respect to the solution described with reference to FIG. 5.

It will be appreciated, on the other hand, that in FIG. 7 and in the subsequent figures, parts, elements, or components that are identical or similar to parts, elements, or components already described previously are designated by the same references, without repeating the description thereof.

In particular, it will be appreciated that FIG. 7 exemplifies embodiments that exploit the possibility, already mentioned previously, of eliminating the average detector 102, assigning to the lowpass characteristic of the control loop the task of averaging the amplitude of the modulating signal received.

One or more embodiments as exemplified in FIG. 7 may envisage introduction of a block for detecting the range of variation of the signal, for example a min/max detector 106, which is designed to act between the output $V_c$ of the error amplifier 104 and an electronic switch (e.g., a MOSFET) 108 coupled to the RFA 100 (and to the capacitor $C_2$).

Figure 8:
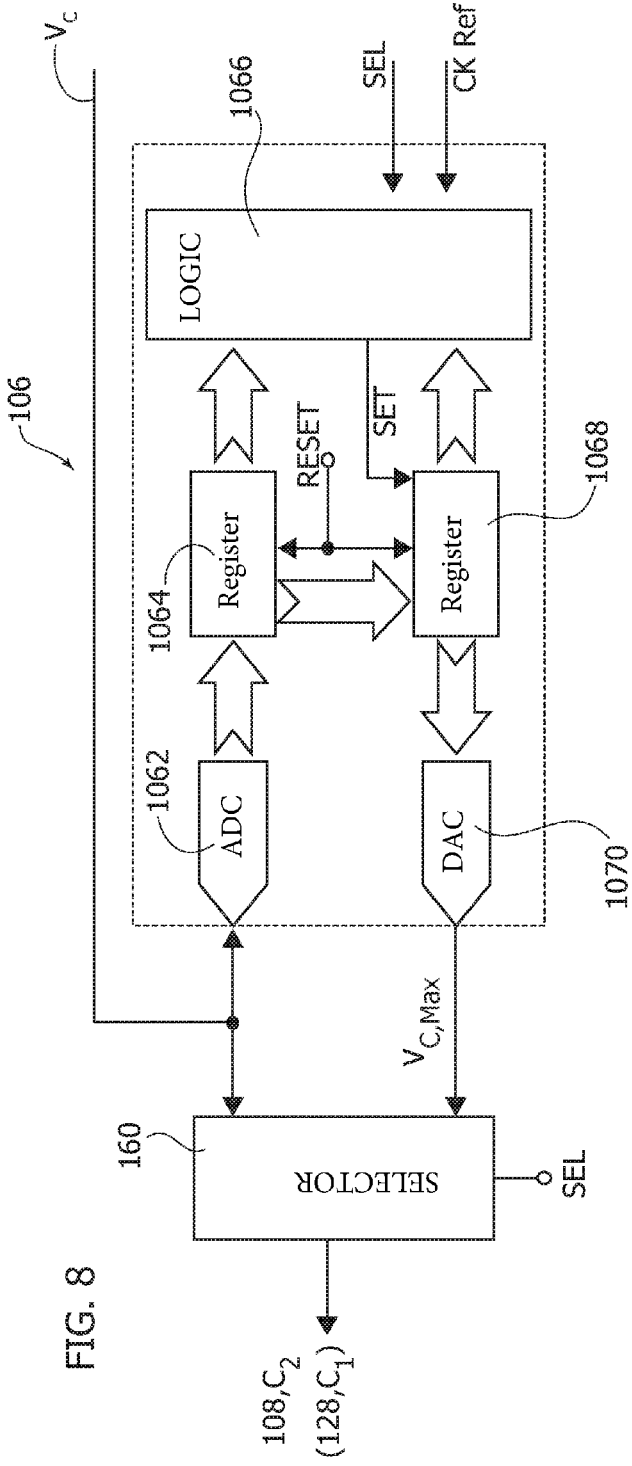
FIG. 8 exemplifies a possible embodiment of a detector of range of variation of a signal (min/max detector)

FIG. 8 exemplifies a possible embodiment of the block 106, such as to enable increase in the overall locking speed of the loop, for example, by reducing the value of the capacitance $C_2$ and increasing the speed of response of the error amplifier 104.

The criterion underlying function of the block 106 is that of determining, for example, the minimum or maximum value (according to the gain-control mechanism on the RFA) of the control signal $V_c$ at output from the error amplifier 104, then imposing it in a static form on the capacitance $C_2$.

In this way, given that the feedback circuit is faster, the control voltage applied to the RFA 100 will follow quite faithfully the envelope of amplitude of the input RF signal IS, it being possible for it to vary (at the data rate) between two possible values corresponding to the input levels of the RF signal.

Consequently, the time for determination of proper voltage control will be reduced.

With reference to FIG. 7, the digital input SEL can be used for setting the instant in which the level of control voltage is definitively chosen and imposed statically at output. Once the control voltage has been set, the control loop may be opened, for example via an electronic switch (e.g., a MOSFET) 108, whereas the remaining analog circuitry that performs the action of feedback can be turned off (so as not to absorb electric power).

In practice, this mechanism can be used if the operating reception window can be considered compatible with the discharge times of the integrated capacitance. Once the block of FIG. 8 sets the correct control voltage, the switch 108 can be opened (i.e., rendered non-conductive) so that the value of the control voltage remains stored on the capacitance $C_2$, enabling turning-off also of the block 106 as a whole (further reducing absorption of electric power).

In one or more embodiments, the functionality of the block 106 can be implemented via the possible implementation appearing in FIG. 8, hence using the control signal (voltage) $V_C$ produced by the error amplifier 104 and initially sending it through a selector 160 directly at output, towards the amplifier 100 and the capacitance $C_2$, through the switch 108 that is assumed as being closed, i.e., in conduction. A digital copy of the input signal $V_C$ converted and digitized through an analog-to-digital converter (ADC) 1062 is stored in a register 1064 (current-value register) and compared, via a digital logic 1066, with the value present in a register 1068 (max/min-value register), which, according to the outcome of the comparison, is or is not updated with the current value.

Finally, a digital-to-analog converter (DAC) 1070 reconverts, into a static signal (voltage) $V_{C,Max}$, the numeric value stored in the register 1068. After a certain operating time, it may be assumed that the state of the selector 160 is modified via the signal SEL so as to transfer at output the static voltage $V_{C,Max}$, turning off the remaining part of the circuit so preventing further updating.

The circuit just exemplified can share at least ideally the clock reference CK Ref obtained by means of the oscillator (OSC) 188 provided in FIG. 5, for operation of the digital logic and of the ADC block.

Figure 9:
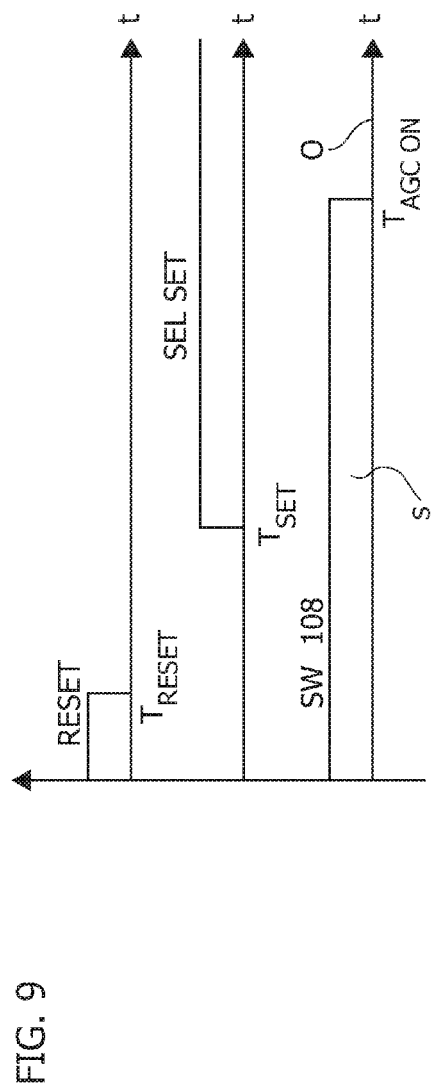
FIG. 9 presents a possible timing chart of digital signals for the management of a gain-control loop.

FIG. 9 exemplifies, in the form of three timing charts that share one and the same time scale t on the abscissae, the possible waveform of some digital control signals of the circuit described previously.

For instance, the signal RESET may serve to reset the contents of the registers 1064, 1068 of the detector 106, whereas the signal SEL SET can serve to select, after a wait time $T_{SET}$, the moment when the selector 160 switches to the voltage $V_{C,Max}$, turning off the remaining circuitry of the loop.

The signal SW 108 can be used after a certain delay for opening the switch 108 present in FIG. 7, passing from a closed (shorted) condition S to an open condition O, at an instant $T_{AGC\_ON}$ that can be ideally viewed as the instant of activation of the stage 10.

Figures 10, 11:
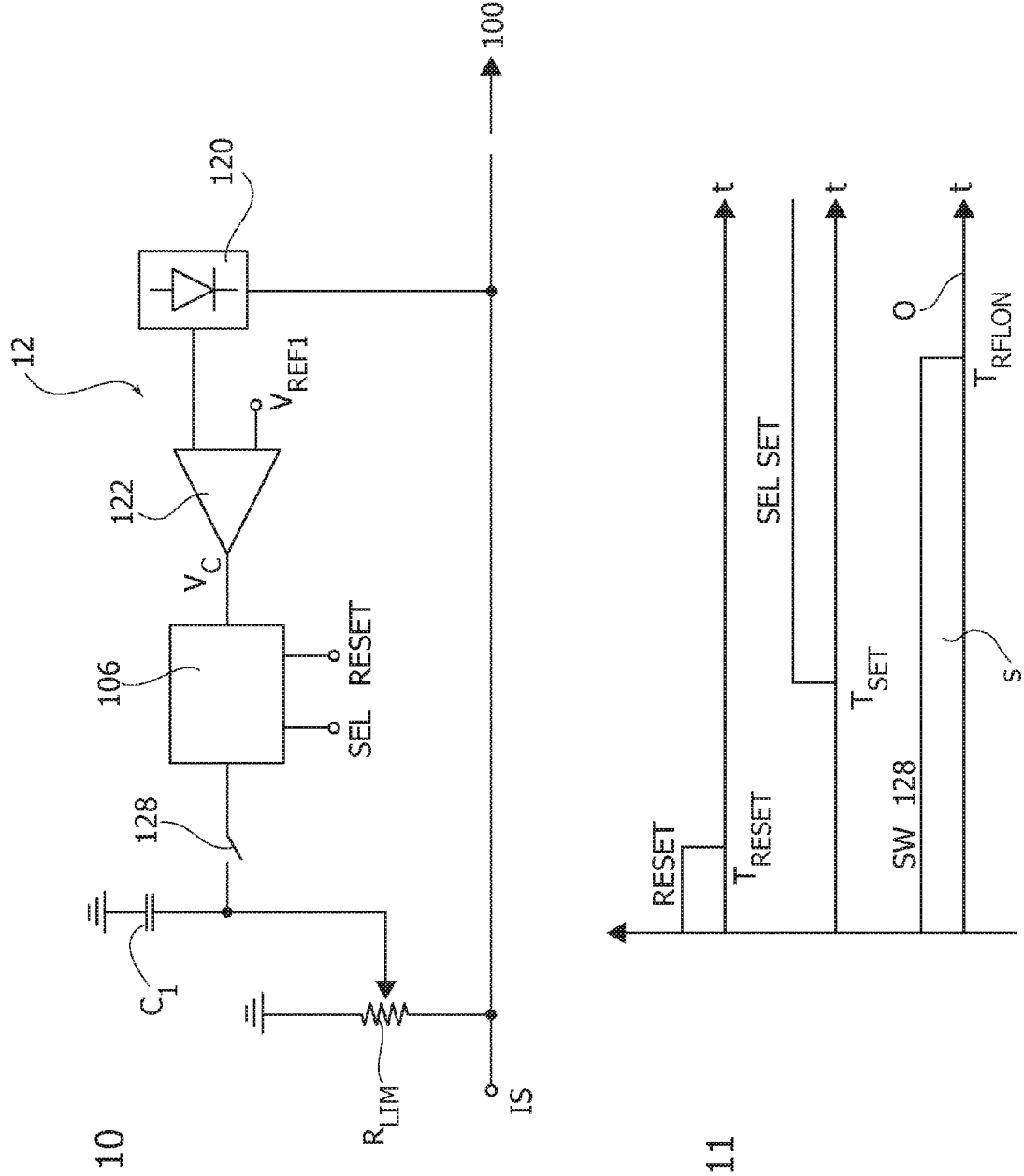
FIG. 10 exemplifies a possible embodiment of an amplitude-limiter loop.
FIG. 11 exemplifies a possible timing chart of digital signals for management of an amplitude-limiter loop.

It has been noted that the criteria exemplified with reference to FIGS. 7 to 9 may be applied, in addition or as an alternative to what has been done for the stage 10, also to the limiter stage 12, for example intervening on the control loop of the RF limiter according to the scheme exemplified in FIG. 10 and with a waveform of the corresponding control signals as exemplified in the timing chart of FIG. 11.

In this regard, it will be appreciated that all the various considerations made previously with reference to the gain-control loop 10 exemplified in FIGS. 7 to 9 may be applied to the amplitude-limiter loop 12 of FIGS. 10 and 11.

In order to prevent any further burdening of the treatment by unnecessarily repeating the corresponding description, is it hence possible simply to compare:

on the one hand, FIGS. 7 and 10, noting that, in the case of the limiter circuit 12 of FIG. 10, the input signal $V_C$ is given by the output signal of the error amplifier 122, where the block 106 (for which the circuit diagram exemplified in FIG. 8 may still apply) acts on a switch 128 that is designed to send back the output of the block 106 between the capacitor $C_1$ and the variable resistance $R_{LIM}$, and on the other hand, FIGS. 9 and 11, noting that, in the case of the limiter stage 12, in FIG. 11, the signal SW 128 now acts on the switch 128.

In this connection, the following may also be noted:

even though, for simplicity of illustration, it has been assumed that the instants of transition (switching) of the signals represented, respectively, in FIG. 9 and in FIG. 11 are the same, this condition is not to be considered as imperative;

possible operation of the circuit 106 has been exemplified with reference to the maximum signal level $V_{C,Max}$; as has already been said, in one or more embodiments (e.g., according to the control mechanism implemented in the loop) a similar operation may be envisaged with reference to the minimum level of the signal $V_C$; this explains why the block 106 is referred to as min/max detector block or, more in general, as range-of-variation detector block.

One or more embodiments may likewise stem from the observation of the possibility of increasing the rate of operation of the baseband circuit 16.

This possibility is irrespective of whether it is implemented as exemplified in FIG. 5 (cascade of AC-coupled amplifiers $16_1, \ldots, 16_n$) or else as exemplified in FIG. 6 (i.e., with a threshold comparator 160).

One or more embodiments may envisage for this purpose accelerating the response of the RC filters used, the time constant of which may be sufficiently long as not to distort the signal at input to the signal decoder.

In one or more embodiments, this result can be achieved by reducing the resistive component of the RC filter via use of a switch (e.g., an electronic switch such as a MOSFET) coupled to the resistance itself to reduce (and virtually set to zero) its value so as to reduce accordingly the time constant during charging of the capacitance.

Figure 12:
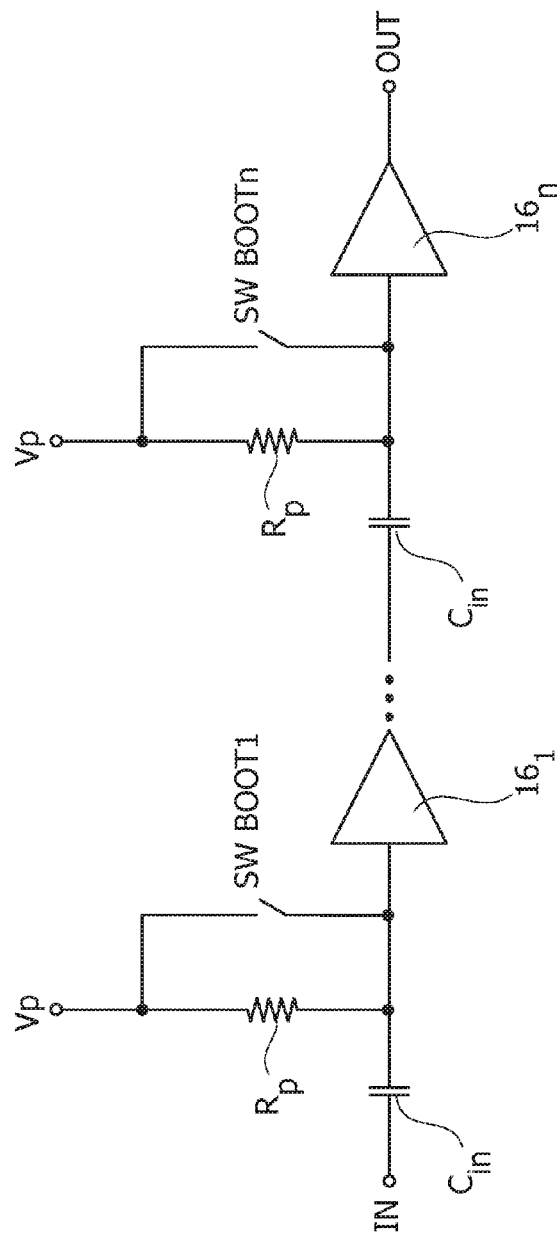
FIG. 12 exemplifies a possible embodiment of a baseband circuit.

An example of application of the above technique (referred to the implementation via cascade of AC-coupled amplifiers $16_1, \ldots, 16_n$) is represented in FIG. 12. Visible in this figure are respective switches SW BOOT1, . . . , SW BOOTn, connected in parallel to the resistances Rp so as that they can short them, for example according to the criteria exemplified in the timing charts of FIG. 13. This figure represents, with reference to a common time abscissa t possible plots of corresponding driving signals, which are also designated for simplicity by SW BOOT1, . . . , SW BOOTn, showing possible switching thereof between the closed (shorted) state 51, SN and the open state O1, . . . , ON.

In this connection, it has been noted that, even though the value of the opening switching times $T_{i,BOOT}$ I=1, . . . , N can depend upon sizing of the RC components, the order in which the switches SW BOOT1, . . . , SW BOOTn, open may affects reduction of the start-up times. In particular, it is possible to get the switches that are positioned on the stages further upstream (SW BOOT1, SW BOOT2, . . . ) of the chain to open before the downstream ones ( . . . , SW BOOTn−1, SW BOOTn) so as to prevent amplification of the effects of charge injection induced by opening of the switches themselves.

The approach exemplified with reference to the implementation via cascade of AC-coupled amplifiers $16_1$, . . . , $16_n$ may of course be applied also to the implementation via threshold comparator of FIG. 6 by acting on the resistance $R_{PB}$, a detailed description herein not being necessary.

Figure 13:
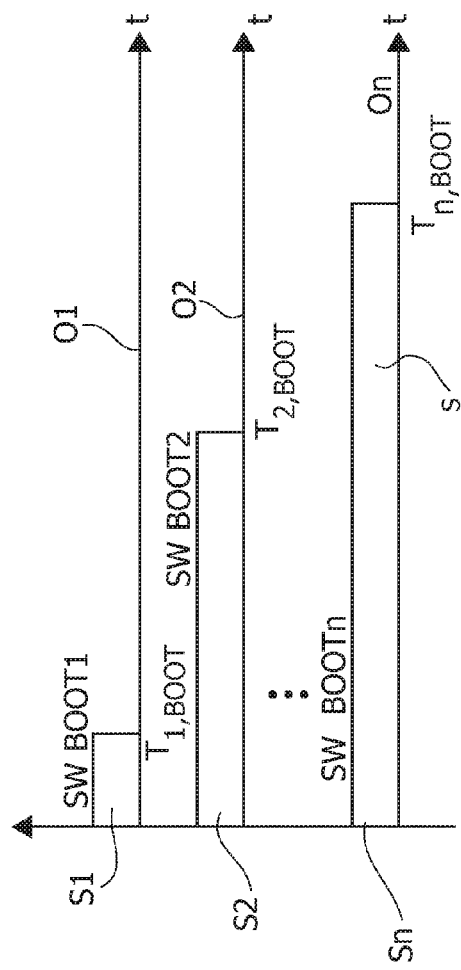
FIG. 13 exemplifies a possible timing chart of digital signals for management of a baseband circuit.

It has likewise been noted that generation of the various digital control signals appearing, for example, in FIGS. 9, 11, and 13 can be performed by introduction of an LC digital logic, which, using the counter and the clock signal CK Ref already envisaged in the signal decoder, can make, upon activation of the system, a series of comparisons between the value present on the counter and previously fixed thresholds that govern the control signals required.

Figure 14:
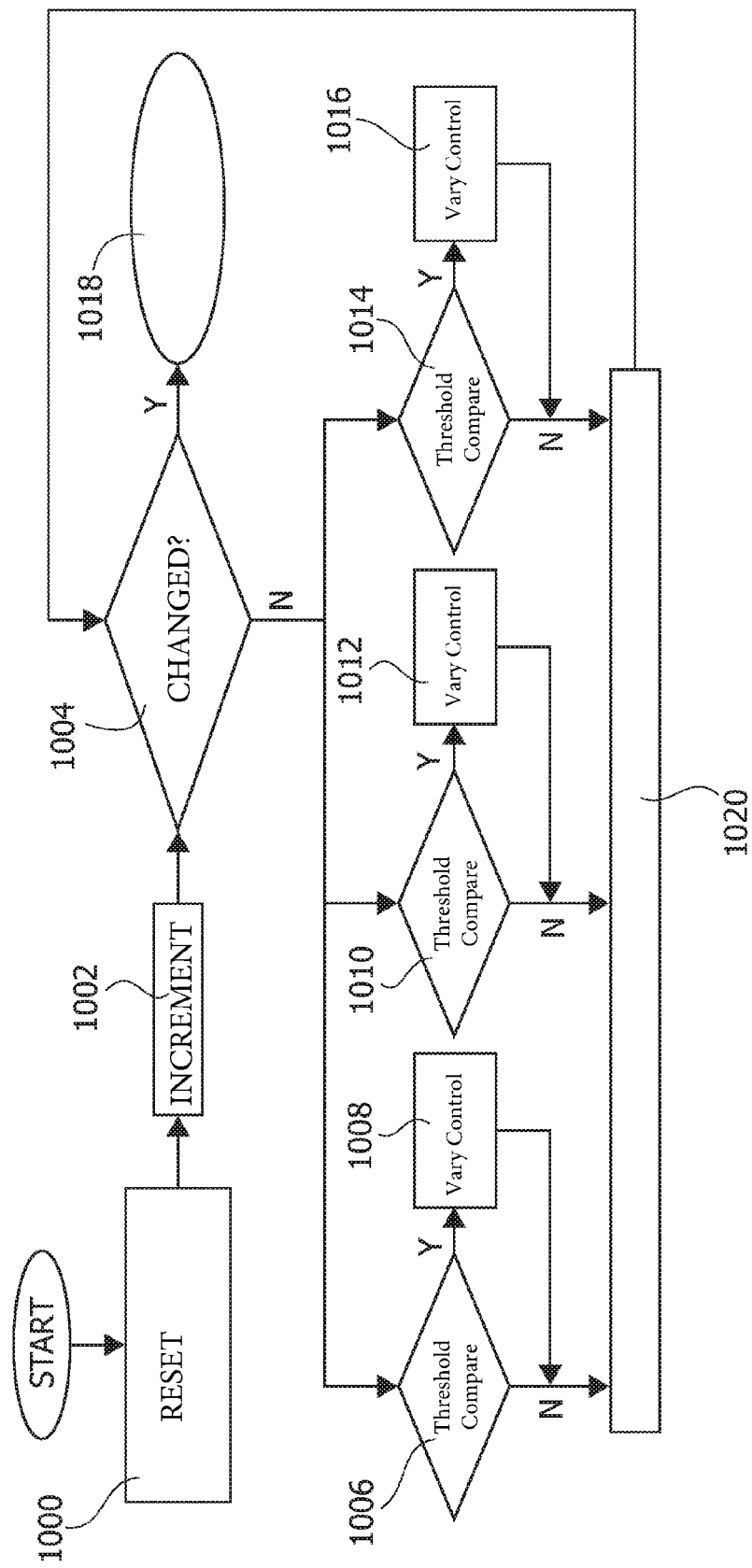
FIG. 14 is a flowchart of a procedure for management of digital control signals.

A possible procedure is exemplified in the flowchart of FIG. 14.

In brief, in one or more embodiments, this procedure may envisage, after a step of START, an initial step 1000 of reset of the counter and of all the registers involved and initialization of the digital signals, which is followed, for each increment 1002 of the value N of the counter, by a step 1004 in which it is evaluated whether all the signals involved have been changed, i.e., at the instant when the value N of the counter reaches the maximum threshold implemented.

If step 1004 indicates (e.g., outcome N) that the above conditions are not satisfied, in steps 1006, 1010, 1014 the aforesaid value is compared with a certain number of thresholds pre-set in the design stage, which produce, in steps 1008, 1012, 1016 the corresponding variation of the digital control signals. The process then returns 1020 to step 1004.

The procedure terminates 1018 when all the signals involved have been changed, i.e., at the instant when the value N of the counter reaches the maximum threshold implemented (outcome Y in step 1004).

At the end of the procedure illustrated, the circuit can be considered operative, and the decoder can start the normal procedure of clock and data recovery as illustrated previously.

Figure 15:
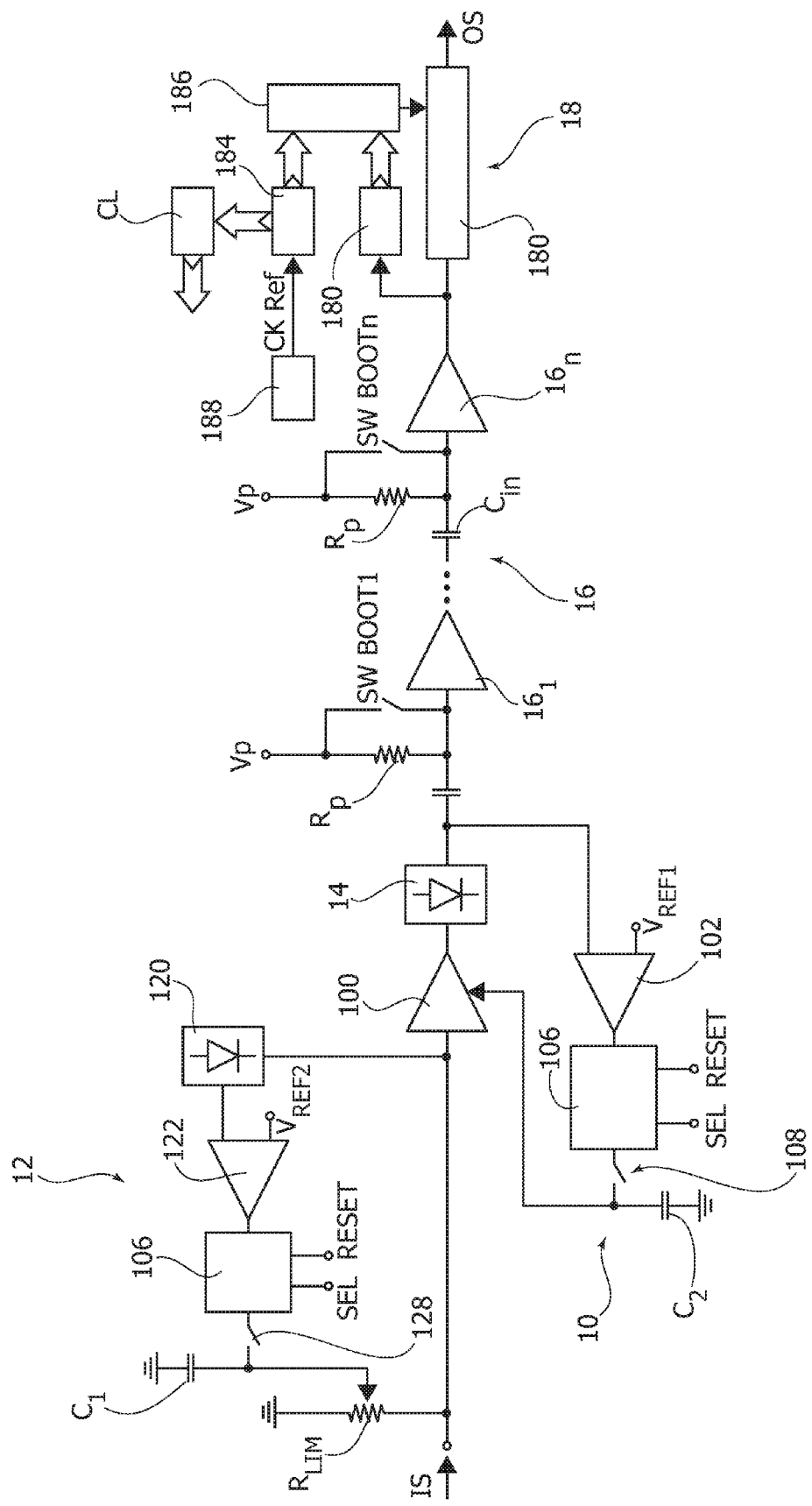
FIG. 15 is an overall diagram of a receiver according to some embodiments.

The diagram of FIG. 15 exemplifies one or more embodiments of a receiver incorporating the various options discussed previously, where the various parts of the receiver are designated by the same references as those used previously. The diagram of FIG. 15 also illustrates the possible presence of a control logic CL that can supervise, for instance, according to the procedure exemplified in FIG. 14, generation of the various control signals seen previously.

One or more embodiments may consequently combine analog and digital circuits to improve the energy efficiency of a reception system, reducing the times of activation in relation to the operating window and overcoming the problem of lack of synchronism between the available clock reference and the data rate of the application.

It will likewise be appreciated that, according to the requirements of application, one or more embodiments may make only partial use of what is exemplified—at the level of complete diagram—in FIG. 15, limiting the use of what has been proposed herein only to a part of the receiver.

One or more embodiments may consequently refer to a receiver for digital signals, the receiver including:

at least one radiofrequency stage (e.g., the variable-gain stage designated by 10 or the amplitude-limiter stage designated by 12) with an input for a modulated radiofrequency signal (e.g., IS), the at least one radiofrequency stage including a feedback loop (e.g., 100, 102, 104, $C_2$ or else 120, 122, $R_{LIM}$, $C_1$) for controlling (e.g., via the AGC circuit 100 or the resistance $R_{LIM}$) the amplitude of said modulated radiofrequency signal as a function of a comparison signal (e.g., $V_C$) produced via comparison (implemented, for example, in the error amplifiers 104 or 122) with a reference value (e.g., $V_{REF1}$, $V_{REF2}$); and a baseband stage (e.g., 16) cascaded to said at least one radiofrequency stage, said baseband stage being coupled to a baseband detector (e.g., the envelope detector 14) acting on said modulated radiofrequency signal; said baseband stage being configured for generating, starting from the detection signal ($X_{BB}(t)$) of said baseband detector, a decodable baseband signal ($X_{DIG}(t)$) and including at least one RC network (e.g., $R_p$, $C_{in}$—FIGS. 5 and 15, or $R_{PB}$, $C_{PB}$—FIG. 6).

In one or more embodiments:

the feedback loop of said at least one radiofrequency stage may include a detector (e.g., 106) for detecting the range of variation of said comparison signal, the detector being configured (see, for example, 160) for controlling the amplitude of the modulated radiofrequency signal as a function of an end value of the range of variation of the comparison signal; and/or the baseband stage may include switching means (e.g., the switches SW BOOT1, . . . , SW BOOTn) for selectively shorting the resistive component ($R_p$; $R_{PB}$) of the at least one RC network.

According to one or more embodiments, detector for detecting the range of variation of the comparison signal may be configured for controlling the amplitude of the aforesaid modulated radiofrequency signal as a function of one between the maximum value and the minimum value of the comparison signal.

According to one or more embodiments, the aforesaid range-of-variation detector may be configured for:

detecting (e.g., in 1066) the occurrence of an end value of the range of variation of the comparison signal; and setting (e.g., via 108, $C_2$ and/or 128, $C_1$) the amplitude of the modulated radiofrequency signal (fixing it) at the end value of the range of variation of the comparison signal.

According to one or more embodiments, the receiver may include a control unit (LC) configured for deactivating (108, $T_{AGC\_ON}$; 128, $T_{RFLON}$)—by interrupting it and possibly turning off the corresponding circuits—the feedback loop of the at least one radiofrequency stage (10, 12) when there is set the amplitude of the modulated radiofrequency signal at the end value.

According to one or more embodiments, the at least one radiofrequency stage may include a gain-control stage (e.g., 10) with a feedback loop for applying the modulated radiofrequency signal to the baseband detector with a gain (e.g., circuit 100) that is a function of a signal (generated, for example, in the error amplifier 104) of comparison of the baseband signal ($X_{BB}(t)$) detected by the baseband detector with a reference value ($V_{REF2}$).

According to one or more embodiments, the aforesaid at least one radiofrequency stage may include an amplitude-limiter stage (e.g., 12) with a respective feedback loop for limiting the amplitude of the modulated radiofrequency signal as a function of a respective signal (obtained, for example, in the error amplifier 122) of comparison of the envelope (obtained, for example, in 120) of the modulated radiofrequency signal with a respective reference value (e.g., $V_{REF1}$).

According to one or more embodiments, there may be provided a control unit (e.g., LC) configured for:
- activating the switching means (SW BOOT1, . . . , SW BOOTn) upon activation of the receiver for selectively shorting the resistive component ($R_p$; $R_{PB}$) of the at least one RC network; and
- deactivating the switching means by removing shorting of the resistive component of said at least one RC network after at least one interval (e.g., $T_{1,BOOT}$, . . . , $T_{n,BOOT}$) from activation of the receiver.

According to one or more embodiments the baseband stage may include a cascade of amplifiers (e.g., $16_1$, . . . , $16n$) AC-coupled, via respective RC networks (e.g., $R_p$, $C_{in}$), to switching means (SW BOOT1, . . . , SW BOOTn), which are coupled to said respective RC networks ($R_p$, $C_{in}$) for selectively shorting the resistive component thereof ($R_p$).

According to one or more embodiments, a control unit (e.g., LC) may be provided, configured for:
- activating, simultaneously with activation of the receiver, the switching means coupled to the respective RC networks ($R_p$, $C_{in}$) for selectively shorting the resistive component thereof; and
- deactivating the aforesaid switching means coupled to the respective RC networks by removing shorting of the resistive component of the respective RC networks after respective intervals ($T_{1,BOOT}$, . . . , $T_{n,BOOT}$) from activation of the receiver, the respective intervals being of a duration monotonically increasing along the cascade of the AC-coupled amplifiers, i.e., with the switching means or switches SW BOOT1, SW BOOT2, . . . , SW BOOTn-1, SW BOOTn that are positioned on the stages set further upstream, for example, SW BOOT1, SW BOOT2, which open in an orderly sequence (see, for example, $T_{1,BOOT} < T_{2,BOOT}, . . . , < T_{n,BOOT}$ in FIG. 13) before the ones that are set downstream, for example, SW BOOTn-1, SW BOOTn.

According to one or more embodiments, a receiver as exemplified herein may include a demodulator stage (e.g., 18) cascaded to the baseband stage for decoding as RZ-ASK signal (e.g., PWM) the decodable baseband signal, preferably likewise providing a clock-recovery function starting from said decodable baseband signal ($X_{DIG}(t)$).

One or more embodiments may likewise provide a process for operating a receiver for digital signals, the receiver including:
- at least one radiofrequency stage with an input for a modulated radiofrequency signal, the at least one radiofrequency stage including a feedback loop for controlling the amplitude of the modulated radiofrequency signal as a function of a comparison signal produced via comparison with a reference value; and
- a baseband stage, cascaded to the at least one radiofrequency stage; the baseband stage being configured for generating, starting from the detection signal ($X_{BB}(t)$) of the baseband detector, a decodable baseband signal ($X_{DIG}(t)$), and including at least one RC network.

In one or more embodiments, the aforesaid process may include:
- controlling the amplitude of the aforesaid modulated radiofrequency signal as a function of an end value of the range of variation of the comparison signal; and/or
- selectively shorting, preferably upon activation of the receiver, the resistive component ($R_p$; $R_{PB}$) of the at least one RC network.

Without prejudice to the underlying principles, the details and the embodiments may vary, even appreciably, with respect to what has been described herein purely by way of non-limiting example, without thereby departing from the extent of protection, as defined by the annexed claims.

The invention claimed is:

1. A receiver for digital signals, comprising:
a radio frequency circuit with an input for receiving a modulated radio frequency signal, said radio frequency circuit including a feedback loop for controlling an amplitude of said modulated radio frequency signal as a function of a comparison with a reference value, and
a baseband circuit cascaded to said radio frequency circuit, said baseband circuit coupled with a baseband detector acting on said modulated radio frequency signal, said baseband circuit configured to generate a decodable baseband signal from a detection signal of said baseband detector and including an RC network, wherein:
the feedback loop of said radio frequency circuit includes a detector of a range of variation of said comparison, said detector configured to control the amplitude of said modulated radio frequency signal as a function of an end value of the range of variation, and
said baseband circuit includes a switching circuit configured to selectively short-circuit a resistive component of said RC network.

2. The receiver of claim 1, wherein said detector of the range of variation of said comparison is configured to control the amplitude of said modulated radio frequency signal as a function of one of a maximum value of said comparison and a minimum value of said comparison.

3. The receiver of claim 1, wherein said detector of the range of variation is configured to:
detect an occurrence of an end value of the range of variation of said comparison, and
set the amplitude of said modulated radio frequency signal modulated as a function of said end value of the range of variation of said comparison.

4. The receiver of claim 3, further including a control circuit configured to deactivate the feedback loop of said at least one radio frequency circuit when setting the amplitude of said modulated radio frequency signal as a function of said end value.

5. The receiver of claim 1, wherein said radio frequency circuit includes a gain control circuit with a feedback loop for applying said modulated radio frequency signal to said baseband detector with a gain that is a function of a comparison signal of said baseband signal detected by said baseband detector with a reference value.

6. The receiver of claim 1, wherein said radio frequency circuit includes a limiter circuit with a feedback loop configured to limit the amplitude of said modulated radio frequency signal as a function of a comparison signal of an envelope of said modulated radio frequency signal with a reference value.

7. The receiver of claim 1, further including a control circuit configured to:
activate said switching circuit upon activation of the receiver so as to selectively short circuit a resistive component of said RC network, and de-activate said switching circuit so as to remove the short circuit from the resistive component of said RC network following at least one interval after receiver activation.

8. The receiver of claim 1, wherein said baseband circuit includes a cascaded arrangement of amplifiers AC-coupled via respective RC networks with said switching circuit coupled to said respective RC networks for selectively short circuiting resistive components of the respective RC networks.

9. The receiver of claim 8, wherein said control circuit is configured to:
   activate simultaneously, upon receiver activation, said switching circuit coupled with said respective RC networks for selectively short circuiting resistive components thereof;
   de-activate said switching circuit coupled with said respective RC networks to remove short circuiting resistive component of said respective RC networks after respective intervals following from receiver activation, said respective intervals having a monotonously increasing duration along the cascaded arrangement of AC-coupled amplifiers.

10. The receiver of claim 1, further including a demodulator circuit cascaded to said baseband circuit for decoding said decodable baseband signal as an RZ-ASK signal and further performing a clock recovery function from said decodable baseband signal.

11. The receiver of claim 1, wherein the RC network is a low pass filter configured to filter the detection signal.

12. A method of operating a receiver for digital signals, wherein the receiver includes:
   a radio frequency circuit with an input for receiving a modulated radio frequency signal, said radio frequency stage including a feedback loop for controlling an amplitude of said modulated radio frequency signal as a function of a comparison with a reference value, and
   a baseband circuit cascaded to said radio frequency circuit, said baseband circuit coupled with a baseband detector acting on said modulated radio frequency signal, said baseband circuit configured to generate a decodable baseband signal from a detection signal of said baseband detector and including an RC network,
   wherein the method comprises:
      controlling the amplitude of said modulated radio frequency signal as a function of an end value of the range of variation of said comparison, and
      selectively short-circuiting, upon receiver activation, a resistive component of said RC network.

13. The method of claim 12, further comprising low pass filing of the detection signal with said RC network.

14. A receiver for digital signals, comprising:
   a radio frequency circuit configured to receive a modulated radio frequency signal and including a variable gain amplifier configured to output an amplified modulated radio frequency signal,
   a baseband detector configured to generate a detection signal from said amplified modulated radio frequency signal,
   a feedback loop configured to receive the detection signal and control an amplification by the variable gain amplifier,
   wherein said feedback loop comprises:
      a comparator circuit configured to compare said detection signal to a reference to generate a comparison signal,
      a circuit configured to detect a range of variation of said comparison signal and generate a control signal comprising one of a minimum or maximum value of said comparison signal,
      a selector circuit having a first input configured to receive the comparison signal and a second input configured to receive said control signal, and
      a control circuit configured to control selection by the selector circuit of the comparison signal for a period of time and then control selection by the selector circuit of the control signal after said period of time, wherein an output of the selector circuit controls the amplification of the variable gain amplifier.

15. The receiver of claim 14, wherein said maximum value is a maximum value of said range of variation and wherein said minimum value is a minimum value of said range of variation.

16. The receiver of claim 14, wherein said control circuit is further configured to deactivate the feedback loop following selection by the selector circuit of the control signal.

17. A receiver for digital signals, comprising:
   a radio frequency circuit configured to receive a modulated radio frequency signal and including a variable gain amplifier configured to output an amplified modulated radio frequency signal,
   a baseband detector configured to generate a detection signal from said amplified modulated radio frequency signal,
   a baseband circuit configured to generate a decodable baseband signal from said detection signal, wherein the baseband circuit includes an RC network, and
   a switching circuit configured to selectively short-circuit a resistive component of said RC network.

18. The receiver of claim 17, further including a control circuit configured to:
   activate said switching circuit upon activation of the receiver so as to selectively shortcircuit the resistive component of said RC network, and
   de-activate said switching circuit so as to remove the shortcircuit from the resistive component of said RC network following at least one interval after receiver activation.

19. The receiver of claim 17, wherein said baseband circuit includes a cascaded arrangement of amplifiers AC-coupled via respective RC networks with said switching circuit coupled to said respective RC networks for selectively shortcircuiting resistive components of the respective RC networks.

20. The receiver of claim 19, further including a control circuit configured to:
   activate simultaneously, upon receiver activation, said switching circuit coupled with said respective RC networks for selectively shortcircuiting resistive components thereof;
   de-activate said switching circuit coupled with said respective RC networks to remove shortcircuiting resistive component of said respective RC networks after respective intervals following from receiver activation.

21. The receiver of claim 20, wherein said respective intervals have a monotonously increasing duration along the cascaded arrangement of AC-coupled amplifiers.

22. The receiver of claim 17, wherein the RC network is a low pass filter configured to filter the detection signal.

* * * * *